US012772551B2

(12) United States Patent
Zhang et al.

(10) Patent No.: US 12,772,551 B2
(45) Date of Patent: Oct. 20, 2026

(54) SEMICONDUCTOR DEVICE HAVING VARYING FIN HEIGHT AND FABRICATION METHOD THEREOF

(71) Applicant: Yangtze Memory Technologies Co., Ltd., Wuhan (CN)

(72) Inventors: Quan Zhang, Wuhan (CN); Boru Xie, Wuhan (CN); Lan Yao, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 515 days.

(21) Appl. No.: 18/345,915

(22) Filed: Jun. 30, 2023

(65) Prior Publication Data

US 2024/0203986 A1 Jun. 20, 2024

Related U.S. Application Data

(60) Provisional application No. 63/433,178, filed on Dec. 16, 2022.

(30) Foreign Application Priority Data

Jun. 25, 2023 (CN) ......................... 202310755804.1

(51) Int. Cl.

| | |
|---|---|
| ***H10D 84/83*** | (2025.01) |
| ***H10D 30/01*** | (2025.01) |
| ***H10D 30/62*** | (2025.01) |
| ***H10D 62/17*** | (2025.01) |
| ***H10D 84/01*** | (2026.01) |
| ***H10D 84/03*** | (2025.01) |
| ***H10P 50/00*** | (2026.01) |
| ***H10P 50/24*** | (2026.01) |
| ***H10P 50/64*** | (2026.01) |

(52) U.S. Cl.
CPC ....... *H10D 84/834* (2025.01); *H10D 84/0142* (2025.01); *H10D 84/0151* (2025.01); *H10D 84/0158* (2025.01); *H10D 84/038* (2025.01)

(58) Field of Classification Search
CPC ............. H10D 84/834; H10D 84/0142; H10D 84/0151; H10D 84/0158; H10D 84/038; H10D 30/024; H10D 84/0128; H10D 62/235; H10D 30/62; H10D 84/856; H01L 21/30604; H01L 21/3065; H01L 21/308
See application file for complete search history.

(56) References Cited

U.S. PATENT DOCUMENTS

| | | | | |
|---|---|---|---|---|
| 10,109,646 B1 * | 10/2018 | Badaroglu | ........... | H10D 84/038 |
| 2017/0069630 A1 * | 3/2017 | Cha | ...................... | H10D 62/115 |
| 2021/0288048 A1 * | 9/2021 | Chuang | .............. | H10D 84/0144 |

* cited by examiner

*Primary Examiner* — Sonya McCall-Shepard
(74) *Attorney, Agent, or Firm* — Anova Law Group, PLLC

(57) ABSTRACT

A semiconductor device fabrication method includes providing a processing wafer including a plurality of semiconductor mesas at least partially surrounded by a dielectric layer, performing a first etching to remove a first portion of the dielectric layer in a first region to form a first recess and a second portion of the dielectric layer in a second region to form a second recess, and performing a second etching to deepen the first recess. A first mesa of the plurality of semiconductor mesas is in the first region, and a second mesa of the plurality of semiconductor mesas is in the second region.

20 Claims, 17 Drawing Sheets

SEMICONDUCTOR DEVICE HAVING VARYING FIN HEIGHT AND FABRICATION METHOD THEREOF

CROSS-REFERENCE TO RELATED APPLICATION

This application claims priority to provisional application No. 63/433,178, filed Dec. 16, 2022, and the priority of Chinese Application No. 202310755804.1, filed on Jun. 25, 2023, the contents of all of which are incorporated herein by reference in their entirety.

FIELD OF THE TECHNOLOGY

This application relates to the field of semiconductor technology and, more particularly, to a semiconductor device and fabrication method thereof.

BACKGROUND OF THE DISCLOSURE

With the continued needs for higher density, lower power consumption, and faster performance in semiconductor devices, such as memory devices, a lot of research has been devoted to the exploration of the utilization of the third dimension, instead of just shrinking the size of the device in the planar directions. One of such technologies is to change the channel of a field-effect transistor (FET) from a planar configuration to a three-dimensional configuration. The FET having such a fin-like structure is also called FinFET.

In a FinFET, a portion of the fin may need to be doped to form a lightly-doped drain (LDD) region, which serves as a buffer between the source/drain and the channel of the FET. The LDD region can be formed by implantation. A memory device usually includes FETs of different types, such as FETs requiring different voltages. Different types of FETs may require LDDs with different junction depths, and hence different implantation depths during the implantation process. However, for a memory device utilizing FinFETs, the conventional fabrication process creates the fins with a same height for different types of FinFETs. Thus, for at least some FinFETs, the junction depth does not match the fin height, resulting in either a waste or a worse device performance.

SUMMARY

In accordance with the disclosure, there is provided a semiconductor device fabrication method including providing a processing wafer including a plurality of semiconductor mesas at least partially surrounded by a dielectric layer, performing a first etching to remove a first portion of the dielectric layer in a first region to form a first recess and a second portion of the dielectric layer in a second region to form a second recess, and performing a second etching to deepen the first recess. A first mesa of the plurality of semiconductor mesas is in the first region, and a second mesa of the plurality of semiconductor mesas is in the second region.

Also in accordance with the disclosure, there is provided a semiconductor device fabrication method including providing a processing wafer including a plurality of semiconductor mesas at least partially surrounded by a dielectric layer, performing a first etching to remove a portion of the dielectric layer in a first region to form a first recess having a first initial depth, performing a second etching to remove a portion of the dielectric layer in a second region to form a second recess having a second initial depth different from the first initial depth, and performing a third etching to deepen the first recess and the second recess. A first mesa of the plurality of semiconductor mesas is in the first region and a second mesa of the plurality of semiconductor mesas is in the second region. The third etching is performed until a vertical distance from a top of the first mesa to a bottom of the first recess reaches a first height and a vertical distance from a top of the second mesa to a bottom of the second recess reaches a second height different from the first height.

Also in accordance with the disclosure, there is provided a semiconductor device including a dielectric layer, a first recess and a second recess formed in the dielectric layer, a first FinFET formed in the first recess and including a first fin, and a second FinFET formed in the second recess and including a second fin. A first recess depth measured from a top of the first fin to a bottom of the first recess is different from a second recess depth measured from a top of the second fin to a bottom of the second recess.

Also in accordance with the disclosure, there is provided a memory system including a memory device and a memory controller configured to control operation of the memory device. The memory device includes a semiconductor device including a dielectric layer, a first recess and a second recess formed in the dielectric layer, a first FinFET formed in the first recess and including a first fin, and a second FinFET formed in the second recess and including a second fin. A first recess depth measured from a top of the first fin to a bottom of the first recess is different from a second recess depth measured from a top of the second fin to a bottom of the second recess.

DESCRIPTION OF EMBODIMENTS

Figure 1A:
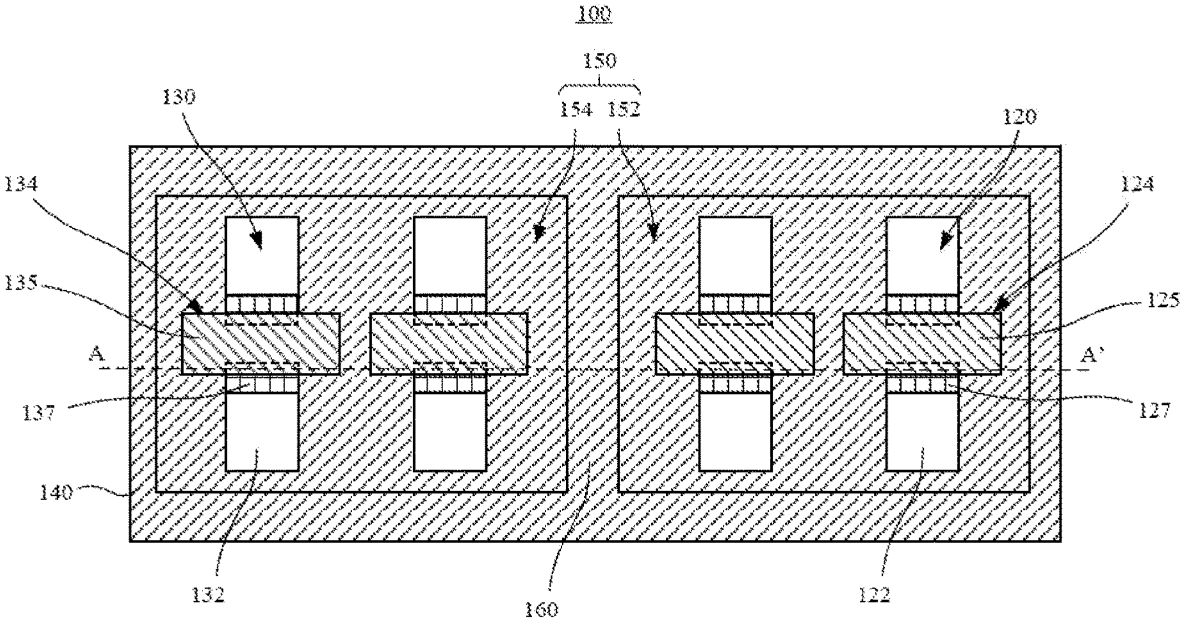
FIG. 1A is a top view of a portion of an example semiconductor device consistent with the disclosure.

The following describes the technical solutions in the embodiments of the present disclosure with reference to the accompanying drawings. Wherever possible, the same reference numbers will be used throughout the drawings to refer to the same or like parts. The described embodiments are merely some but not all of the embodiments of the present disclosure. Other embodiments obtained by a person skilled in the art based on the embodiments of the present disclosure without creative efforts shall fall within the scope of the present disclosure.

References in the specification to "one embodiment," "an embodiment," "an exemplary embodiment," "some embodiments," etc., indicate that the embodiment described may include a particular feature, structure, or characteristic, but not every embodiment necessarily includes the particular feature, structure, or characteristic. Moreover, such phrases do not necessarily refer to the same embodiment.

Further, when a particular feature, structure or characteristic is described in connection with an embodiment, it would be within the knowledge of a person skilled in the art to effect such feature, structure or characteristic in connection with other embodiments whether or not explicitly described. A person of ordinary skill in the art can make modifications to the described embodiments according to the principle of the present disclosure. For example, one or more components of the disclosed device can be omitted or one or more components not explicitly described above can be added to the device. Similarly, one or more steps in the disclosed method can be omitted or one or more steps not explicitly described above can be included in the method.

Unless otherwise defined, all technical and scientific terms used in this disclosure have the same or similar meanings as generally understood by those having ordinary skill in the art. As described herein, the terms used in the specification of the present disclosure are intended to describe example embodiments, instead of limiting the present disclosure. In general, terminology may be understood at least in part from usage in context. For example, the term “one or more” as used herein, depending at least in part upon context, may be used to describe any feature, structure, or characteristic in a singular sense or may be used to describe combinations of features, structures, or characteristics in a plural sense. Similarly, terms, such as “a,” “an,” or “the,” may be understood to convey a singular usage or to convey a plural usage, depending at least in part upon context.

As used herein, when a first component is referred to as “fixed to” a second component, it is intended that the first component may be directly attached to the second component or may be indirectly attached to the second component via another component. When a first component is referred to as “connecting” to a second component, it is intended that the first component may be directly connected to the second component or may be indirectly connected to the second component via a third component between them. The terms “vertical,” “horizontal,” “up,” “down,” “left,” “right,” “perpendicular,” “parallel,” and similar expressions used herein, are merely intended for purposes of description. For example, phrases indicating directions, such as “vertical,” “horizontal,” “up,” “down,” “left,” and “right,” are to be understood as indicating the directions in the drawings with the orientation shown therein. The term “and/or” used herein includes any suitable combination of one or more related items listed.

In this disclosure, a value or a range of values may refer to a desired, target, or nominal value or range of values and can include slight variations. The term “about” or “approximately” associated with a value can allow a variation within, for example, 10% of the value, such as ±2%, ±5%, or ±10% of the value, or another proper variation as appreciated by those having ordinary skill in the art. The term “about” or “approximately” associated with a state can allow a slight deviation from the state. For example, a first component being approximately perpendicular to a second component can indicate that the first component is either exactly perpendicular to the second component or slightly deviates from being perpendicular to the second component, and an angle between the first and second components can be within a range from, e.g., 80° to 100°, or another proper range as appreciated by those having ordinary skill in the art.

Figure 1B:
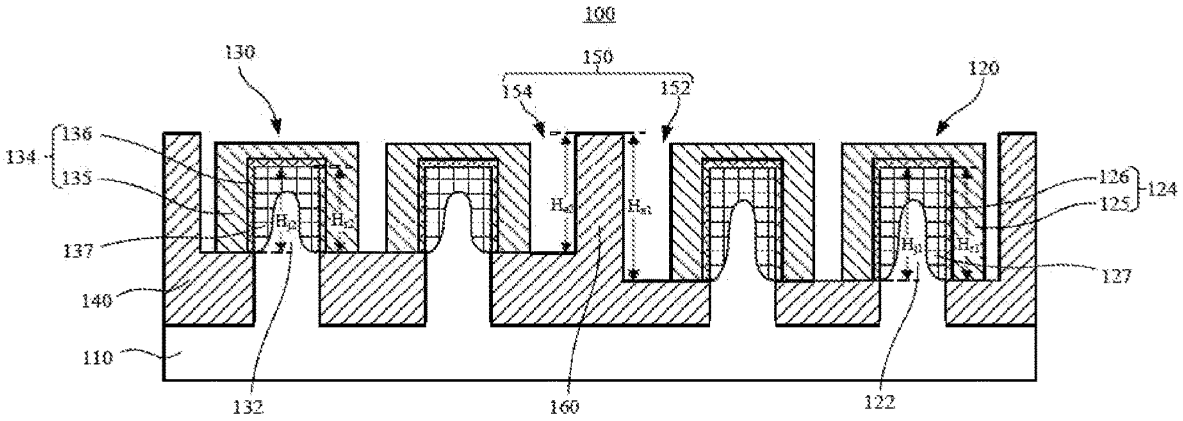
FIG. 1B is a cross-sectional view of the portion of the example semiconductor device consistent with the disclosure.

FIGS. 1A and 1B are schematic diagrams showing a portion of an example semiconductor device 100 consistent with the disclosure. FIG. 1A is a top view and FIG. 1B is a cross-sectional view along line A-A' in FIG. 1A. As shown in FIGS. 1A and 1B, the semiconductor device 100 includes a substrate 110, and a first fin-type field-effect transistor (FinFET) 120 and a second FinFET 130 formed over the substrate 110. The substrate 110 can be formed of one or more suitable semiconductor materials, such as one or more of silicon (Si), germanium (Ge), silicon germanium (SiGe), indium phosphide (InP), gallium arsenide (GaAs), gallium nitride (GaN), and silicon carbide (SiC), or a combination of suitable semiconductor and insulation materials, such as silicon on insulator (SOI). Further, the substrate 110 can be single crystalline or part of the substrate 110 can be amorphous or polycrystalline.

The first FinFET 120 and the second FinFET 130 can be of different types. In some embodiments, the first FinFET 120 and the second FinFET 130 can serve different purposes in the semiconductor device 100. For example, the semiconductor device 100 can be a memory device, and a memory device can include various transistors that are used to realize different control functions of the memory device, which can require different operation voltages (e.g., gate voltages). For example, a transistor for operations on memory cells, such as programming, erasing, etc., can require an operation voltage of about 20 V (such a transistor is also referred to as a “high-voltage (HV) transistor”); a transistor used in a buffer region of the memory device can require an operation voltage of about 1.8 V to about 3.3 V (such a transistor is also referred to as a “low-voltage (LV) transistor”); and a transistor for signal outputs can require an operation voltage of about 1.1 V to about 1.2 V (such a transistor is also referred to as a “low-low-voltage (LLV) transistor”). In some embodiments, the first FinFET 120 can be, e.g., an LV transistor of the memory device and the second FinFET 130 can be, e.g., an LLV transistor of the memory device.

As shown in FIGS. 1A and 1B, the first FinFET 120 includes a first fin 122 formed over the substrate 110 and a first gate structure 124. The first fin 122 can be formed by patterning and etching the substrate 110 and/or a semiconductor layer over the substrate 110. The semiconductor layer can be formed of one or more suitable semiconductor materials, such as one or more of silicon (Si), germanium (Ge), silicon germanium (SiGe), indium phosphide (InP), gallium arsenide (GaAs), gallium nitride (GaN), and silicon carbide (SiC). The semiconductor layer can be formed of a same material as or a different material than the substrate 110. FIGS. 1A and 1B show an example in which the first fin 122 is formed from the substrate 110.

As shown in FIGS. 1A and 1B, the first gate structure 124 extends from one side (e.g., a left side) of the first fin 122, over a top of the first fin 122, and to another side (e.g., a right side) of the first fin 122. Thus, the first gate structure 124 covers at least a portion of the left side, at least a portion of the right side, and at least a portion of the top of the first fin 122. The first gate structure 124 includes a first gate conductor layer 125 and a first gate insulation layer 126 (also referred to as a “first gate dielectric layer”) sandwiched between the first fin 122 and the first gate conductor layer 125. The first gate insulation layer 126 can include one or more dielectric materials, such as one or more of silicon oxide, silicon nitride, and silicon oxynitride. The first gate conductor layer 125 can include one or more conductor materials, such as one or more of doped silicon (e.g., doped polycrystalline silicon), tungsten (W), cobalt (Co), copper (Cu), aluminum (Al), and silicides.

As shown in FIG. 1B, the first fin 122 includes a first lightly-doped drain (LDD) region 127. The first LDD 127 can be formed by implanting dopant impurities into the first fin 122. The dopant for the first LDD region 127 can be the same as or similar to the dopant for the source/drain of the first FinFET 120, but the doping level in the first LDD region 127 can be lower than the doping level in the source/drain of the first FinFET 120. As shown in FIGS. 1A and 1B, the first LDD region 127 is formed near and across a boundary of the first gate structure 124 in the channel length direction of the first FinFET 120. The first LDD region 127 extends from surfaces (such as the top surface and the side surfaces) of the first fin 122 into the interior of the first fin 122. A junction is formed at the boundary between the first LDD region 127 and the other region of the first fin 122. A vertical distance between the top of the first fin 122 and a lowest point of the first LDD region 127 (i.e., a point of the first LDD region 127 closest to the substrate 110) can be referred to as a first "junction depth" of the first LDD region 127, which is labeled as $H_{j1}$ in FIG. 1B. The first junction depth can be, e.g., from about 20 nm to about 140 nm, such as about 80 nm.

Similarly, the second FinFET 130 includes a second fin 132 formed over the substrate 110 and a second gate structure 134. The second fin 122 can be formed by patterning and etching the substrate 110 and/or a semiconductor layer over the substrate 110. The semiconductor layer can be formed of one or more suitable semiconductor materials, such as one or more of silicon (Si), germanium (Ge), silicon germanium (SiGe), indium phosphide (InP), gallium arsenide (GaAs), gallium nitride (GaN), and silicon carbide (SiC). The semiconductor layer can be formed of a same material as or a different material than the substrate 110. FIGS. 1A and 1B show an example in which the second fin 132 is formed from the substrate 110. In some other embodiments, the first fin 122 and the second fin 132 can be formed from a semiconductor layer formed over the substrate 110.

As shown in FIGS. 1A and 1B, the second gate structure 134 extends from one side (e.g., a left side) of the second fin 132, over a top of the second fin 132, and to another side (e.g., a right side) of the second fin 132. Thus, the second gate structure 134 covers at least a portion of the left side, at least a portion of the right side, and at least a portion of the top of the second fin 132. The second gate structure 134 includes a second gate conductor layer 135 and a second gate insulation layer 136 (also referred to as a "second gate dielectric layer") sandwiched between the second fin 132 and the second gate conductor layer 135. The second gate insulation layer 136 can include one or more dielectric materials, such as one or more of silicon oxide, silicon nitride, and silicon oxynitride. The second gate conductor layer 135 can include one or more conductor materials, such as one or more of doped silicon (e.g., doped polycrystalline silicon), tungsten (W), cobalt (Co), copper (Cu), aluminum (Al), and silicides.

In the example shown in FIG. 1B, a top of the first gate structure 124 is approximately flush with a top of the second gate structure 134. In some other examples, the top of the first gate structure 124 can be not flush with the top of the second gate structure 134. For example, the top of the first gate structure 124 can be higher than the top of the second gate structure 134, or vice versa. The height difference between the top of the first gate structure 124 and the top of the second gate structure 134 can result from the height difference between the top of the first fin 122 and the top of the second fin 132 and/or the thickness difference between the first gate structure 124 and the second gate structure 134. For example, the top of the first fin 122 can be flush with the top of the second fin 132 while the first gate structure 124 can be thicker than the second gate structure 134, and hence the top of the first gate structure 124 can be higher than the top of the second gate structure 134. As another example, the top of the first fin 122 can be higher than the top of the second fin 132 while the thickness of the first gate structure 124 can be approximately same as the thickness of the second gate structure 134, and hence the top of the first gate structure 124 can be higher than the top of the second gate structure 134.

As shown in FIG. 1B, the second fin 132 includes a second LDD region 137. The second LDD 137 can be formed by implanting dopant impurities into the second fin 132. The dopant for the second LDD region 137 can be the same as or similar to the dopant for the source/drain of the second FinFET 130, but the doping level in the second LDD region 137 can be lower than the doping level in the source/drain of the second FinFET 130. As shown in FIGS. 1A and 1B, the second LDD region 137 is formed near and across a boundary of the second gate structure 134 in the channel length direction of the second FinFET 130. The second LDD region 137 extends from surfaces (such as the top surface and the side surfaces) of the second fin 132 into the interior of the second fin 132. A junction is formed at the boundary between the second LDD region 137 and the other region of the second fin 132. A distance between the top of the second fin 132 and a lowest point of the second LDD region 137 (i.e., a point of the second LDD region 137 closest to the substrate 110) can be referred to as a second "junction depth" of the second LDD region 137, which is labeled as $H_{j2}$ in FIG. 1B. The second junction depth can be, e.g., from about 10 nm to about 90 nm, such as about 50 nm.

As shown in FIGS. 1A and 1B, the semiconductor device 100 further includes a dielectric layer 140 formed over the substrate 110. The dielectric layer 140 can include one or more dielectric materials, such as one or more of silicon oxide, silicon nitride, and silicon oxynitride. The first FinFET 120 and the second FinFET 130 are formed in and/or on the dielectric layer 140.

As shown in FIGS. 1A and 1B, a plurality of recesses 150 are formed in the dielectric layer 140, which surround at least a portion of each of the first fin 122 and the second fin 132. Each of the first gate structure 124 and the second gate structure 134 is at least partially in one or more of the plurality of recesses 150. The plurality of recesses 150 include a first recess 152 in which the first fin 122 is formed and a second recess 154 in which the second fin 132 is formed.

As shown in FIGS. 1A and 1B, the semiconductor device 100 further includes an isolator 160, isolating the first FinFET 120 from the second FinFET 130, as well as isolating the first and second FinFETs 120, 130 from other parts of the semiconductor device 100. The isolator 160 can protrude in a direction away from the substrate 110, and can be formed during the process of forming the plurality of recesses 150. For example, during the process of forming the plurality of recesses 150, the dielectric layer 140 is patterned and etched, and the etched portions form the plurality of recesses 150 while the remaining portions form the isolator 160. That is, the isolator 160 can be portion(s) of the dielectric layer 140.

A vertical distance from the top of the first fin 122 to a bottom of the first recess 152 is a height of the first fin 122 (also referred to as a "first fin height" or "first height").

Similarly, a vertical distance from the top of the second fin 132 to a bottom of the second recess 154 is a height of the second fin 132 (also referred to as a "second fin height" or "second height"). Although the top of the first fin 122 and the top of the second fin 132 are not necessarily flush with a top of the isolator 160, a relative height of the top of a fin to the bottom of a recess within which the fin is located can be used to characterize a depth of the recess in the present disclosure, which can also be viewed as how much the bottom of the recess is "recessed" as compared to the top of the fin. Therefore, the vertical distance from the top of the first fin 122 to the bottom of the first recess 152 can be referred to as a first "recess depth" of the first recess 152, which is labeled as $H_{r1}$ in FIG. 1B. In some embodiments, the first recess depth of the first recess 152 (and hence the height of the first fin 122) can approximately equal the first junction depth of the first LDD region 127. Similarly, the vertical distance from the top of the second fin 132 to the bottom of the second recess 154 can be referred to as a second "recess depth" of the second recess 154, which is labeled as $H_{r2}$ in FIG. 1B. In some embodiments, the second recess depth of the second recess 154 (and hence the height of the second fin 132) can approximately equal the second junction depth of the second LDD region 137.

Further, as shown in FIG. 1B, the first recess depth is greater than the second recess depth and correspondingly the first junction depth is greater than the second junction depth. Therefore, the first FinFET 120 can sustain a higher operation voltage (higher gate voltage) than the second FinFET 130. Thus, for example, the first FinFET 120 can be used in a buffer region of a memory device, and the second FinFET 130 can be used for signal outputs in a memory device. That is, the first FinFET 120 can be an LV transistor and the second FinFET 130 can be an LLV transistor.

The first recess depth and the second recess depth can depend on the applications of the first FinFET 120 and the second FinFET 130. In some embodiments, the first recess depth can be in a range from about 60 nm to about 100 nm, such as about 80 nm. In some embodiments, the second recess depth can be in a range from about 40 nm to about 60 nm, such as about 50 nm. Similarly, the difference between the first recess depth and the second recess depth (also referred to as a "recess depth difference" or "fin height difference") can depend on the applications of the first FinFET 120 and the second FinFET 130, and can be, e.g., from about 0 nm to about 130 nm. In some embodiments, the difference between the first and second recess depths can be from about 0 nm to about 20 nm, e.g., from about 10 nm to about 20 nm, such as about 15 nm. In some embodiments, the difference between the first and second recess depths can be from about 0 nm to about 40 nm, e.g., from about 30 nm to about 40 nm, such as about 35 nm.

In the disclosure, the recesses can be formed by etching. The vertical distance from the top of the isolator 160 to the bottom of a recess can also be referred to as an "etching depth" of the recess. For example, the vertical distance from the top of the isolator 160 to the bottom of the first recess 152 can be referred to as a "first etching depth" and similarly the vertical distance from the top of the isolator 160 to the bottom of the second recess 154 can be referred to as a "second etching depth." The first etching depth and the second etching depth are labeled as $H_{e1}$ and $H_{e2}$, respectively, in FIG. 1B. In some embodiments, as shown in FIG. 1B, the first etching depth is greater than the second etching depth. The difference between the first etching depth and the second etching depth can be referred to as an "etching depth difference."

The etching depth difference and the recess depth difference can be correlated or unrelated. In the example shown in FIG. 1B, the top of the first fin 122 is approximately flush with the top of the second fin 132. Therefore, the recess depth difference can approximately equal the etching depth difference. In some other examples, the recess depth difference can be greater than or smaller than the etching depth difference. For example, the top of the first fin 122 can be higher than the top of the second fin 132, and hence the recess depth difference is greater than the etching depth difference.

In the example shown in FIGS. 1A and 1B, two first FinFET 120 are formed in the first recess 152 and two second FinFET 130 are formed in the second recess 154. This is merely for illustrative purposes. The number of first FinFET 120 in the first recess 152 and the number of second FinFET 130 in the second recess 154 can be any other suitable number, such as one or more than two.

The semiconductor device 100 can further include other components/structures not explicitly shown in FIGS. 1A and 1B, such as dielectric layer(s) covering the first FinFET(s) 120 and the second FinFET(s) 130, wirings and contacts providing electrical access to various parts of the semiconductor device 100 (e.g., source, drain, and gate of a FinFET), etc. The semiconductor 100 can also include one or more FETs different from the first FinFET(s) and the second FinFET(s), such as transistor(s) for operations on memory cells (e.g., programming, erasing, etc.) that do not require a fin structure (e.g., HV transistor(s)).

The disclosure also provides a semiconductor device fabrication method, examples of which are described in more detail below. FIGS. 2A-2I are cross-sectional views showing certain stages during an example fabrication process of an example semiconductor device consistent with the disclosure. FIGS. 2A-2I only show a portion of the semiconductor device. The semiconductor device can be, e.g., the semiconductor device 100 described above.

Figure 2A:
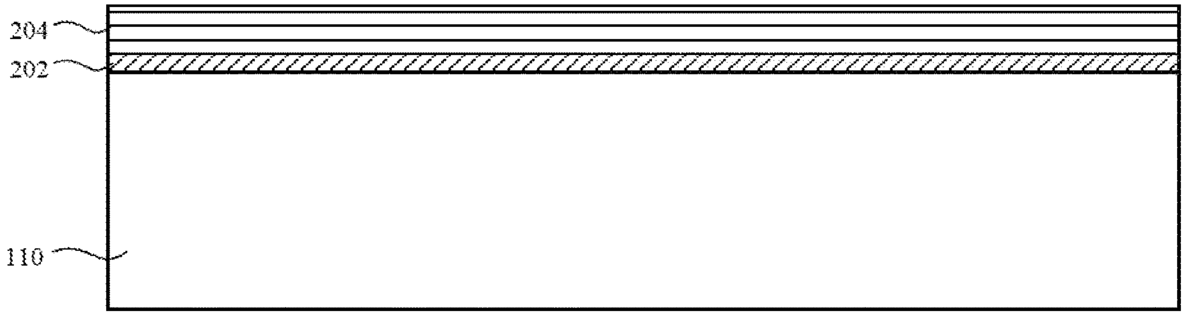
FIGS. 2A-2I are cross-sectional views showing certain stages during an example fabrication process of an example semiconductor device consistent with the disclosure.

At the stage shown in FIG. 2A, a first dielectric layer 202 and a second dielectric layer 204 are formed one after another over the substrate 110. In this disclosure, a wafer with any layer or structure formed over a substrate can be referred to as a "processing wafer." The first dielectric layer 202 and the second dielectric layer 204 can be used as etching stop layers in various subsequent etching processes, and can also be referred to as a "first etching stop layer" and a "second etching stop layer," respectively. The first dielectric layer 202 and the second dielectric layer 204 can be formed of different dielectric materials. In some embodiments, the materials for the first dielectric layer 202 and the second dielectric layer 204 are selected such that a suitable etching selectivity (such as larger than 10:1) can be achieved, e.g., between the first dielectric layer 202 and the substrate 110, between the first dielectric layer 202 and the second dielectric layer 204, and/or between the second dielectric layer 204 and a material layer formed over the second dielectric layer 204. For example, the first dielectric layer 202 can be made of silicon oxide and the second dielectric layer 204 can be made of silicon nitride.

The first dielectric layer 202 and the second dielectric layer 204 can be formed by suitable methods, such as film growth or deposition. In some embodiments, the first dielectric layer 202 and the second dielectric layer 204 can be deposited over the substrate 110 using chemical vapor deposition. In some other embodiments, the first dielectric layer 202 can be formed by oxidizing a top part of the substrate 110. For example, in the scenario that the substrate 110 includes silicon, a top part of the substrate 110 can be subject to thermal oxidation to form a silicon oxide layer as the first dielectric layer 202.

Figure 2B:
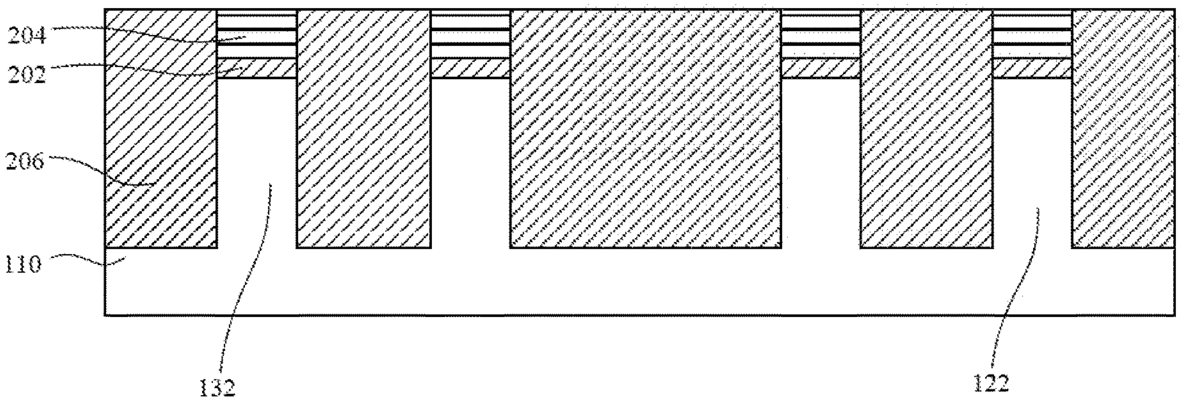

After the first dielectric layer 202 and the second dielectric layer 204 are formed, a photolithography process can be performed to form a plurality of trenches in the processing wafer. The plurality of trenches can penetrate through the first dielectric layer 202 and the second dielectric layer 204, and into the substrate 110 to a certain depth, as shown in FIG. 2B. The plurality of trenches divide an upper part of the substrate 110, the first dielectric layer 202, and the second dielectric layer 204 into a plurality of mesas. The plurality of mesas (with or without the remaining parts of the first dielectric layer 202 and the second dielectric layer 204) can be referred to as a plurality of semiconductor mesas. Part of each mesa can serve as the first fin 122 or the second fin 132 in the final semiconductor device.

After the lithography process, a dielectric material can be deposited into the plurality of trenches to form a dielectric layer 206, as shown in FIG. 2B. In some embodiments, the dielectric material can be deposited all over the processing wafer and then the deposited dielectric material layer can be etched back or subjected to chemical-mechanical polishing to expose the top surfaces of the semiconductor mesas (such as top surfaces of the remaining parts of the second dielectric layer 204). The dielectric layer 206 isolates the plurality of semiconductor mesas from each other and can also be referred to as a "shallow trench isolation layer." That is, the semiconductor mesas can be at least partially surrounded by the dielectric layer 206. In some embodiments, the material of the dielectric layer 206 can be the same as the first dielectric layer 202. For example, both the first dielectric layer 202 and the dielectric layer 206 can be made of silicon oxide.

Figure 2C:
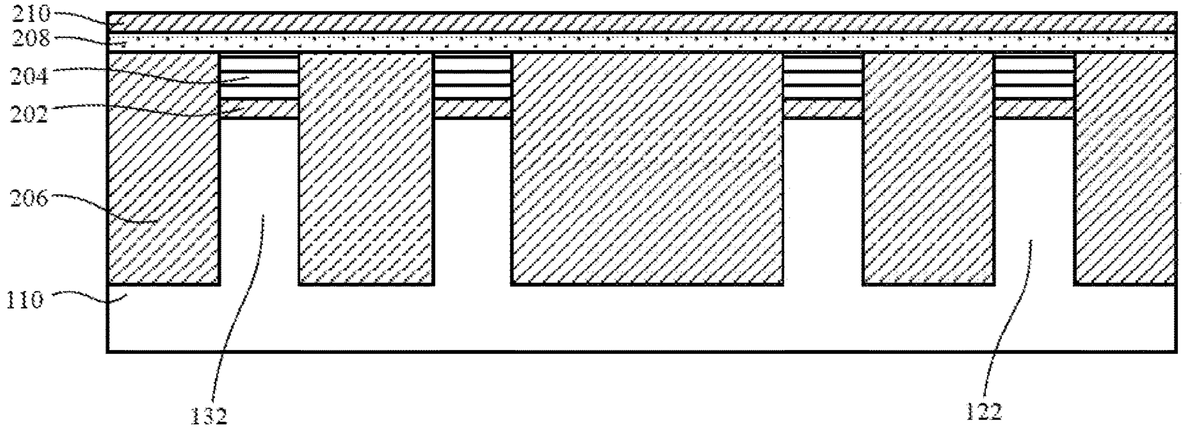

FIG. 2C schematically shows a next stage during the fabrication of the semiconductor device. As shown in FIG. 2C, a hard-mask layer 208 and a dielectric layer 210 are formed one after another over the processing wafer. The hard-mask layer 208 and the dielectric layer 210 cover the semiconductor mesas and the dielectric layer 206. The dielectric layer 206 can also be referred to as a "cover layer." In some embodiments, the materials for the hard-mask layer 208 and the dielectric layer 210 are selected such that a suitable etching selectivity (such as larger than 10:1) can be achieved, e.g., between the hard-mask layer 208 and they layer(s) therebelow (such as the dielectric layer 206 and/or the second dielectric layer 204), and/or between the hard-mask layer 208 and the dielectric layer 210. For example, the hard-mask layer 208 can include carbon-doped silicon nitride and/or amorphous silicon. Further, the dielectric layer 210 can include a same material as that for the dielectric layer 206, such as silicon oxide.

Figure 2D:
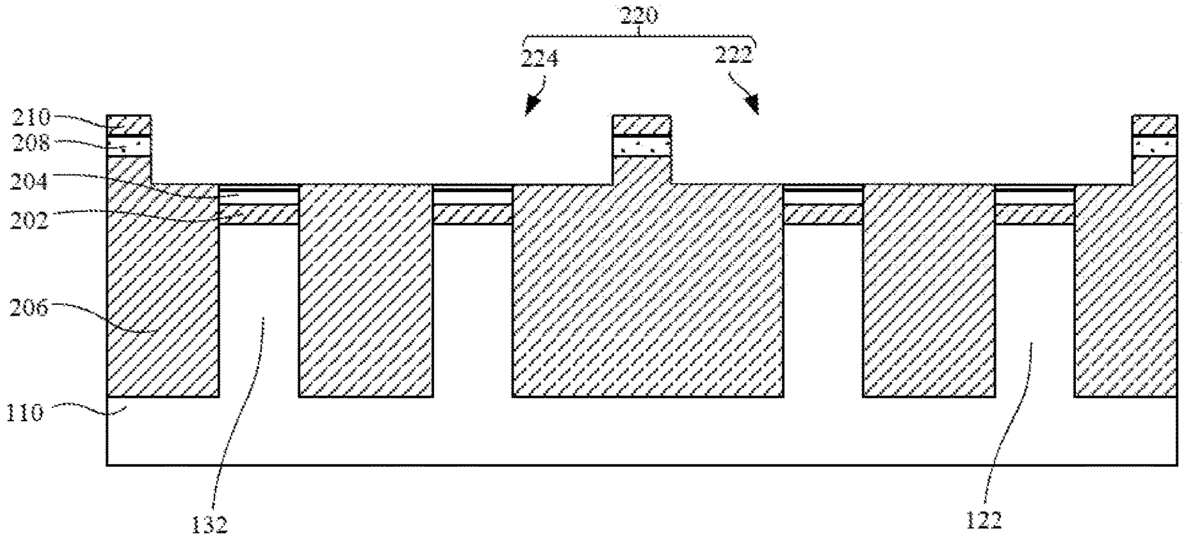

FIG. 2D schematically shows a next stage during the fabrication of the semiconductor device. As shown in FIG. 2D, at this stage, the hard-mask layer 208 and the dielectric layer 210 are patterned using, e.g., photolithography, to expose a plurality of regions for forming the transistors. The plurality of regions can include, e.g., a first region corresponding to the first FinFET(s) 120 that is to be formed at the end of the fabrication process and a second region corresponding to the second FinFET(s) 130 that is to be formed at the end of the fabrication process. That is, the mesa(s) used as the first fin(s) 122 of the first FinFET(s) 120 are located in the first region and the mesa(s) used as the second fin(s) 132 of the second FinFET(s) 132 are located in the second region.

In this patterning process, portions of the dielectric layer 206 can also be etched away. As shown in FIG. 2D, this patterning process forms a plurality of initial recesses 220 in the plurality of regions, including a first initial recess 222 and a second initial recess 224. In some embodiments, the plurality of initial recesses 220 can have an approximately same depth.

In the example shown in FIG. 2D, the etching of the patterning process ends at the second dielectric layer 204, i.e., the bottoms of the initial recesses 220 can be at the level of the second dielectric layer 204. In some scenarios, portions of the second dielectric layer 204 may also be etched away. In this disclosure, as long as an etching process does not completely remove a layer, the etching can be referred to as ending at the layer. For example, here, as long as a certain portion of the second dielectric layer 204 is left, the etching can be referred to as ending at the second dielectric layer 204. In some other embodiments, the second dielectric layer 204 can be completely removed and the etching can end at the first dielectric layer 202.

The patterning process to form the initial recesses can include one etching process using one etchant or several etching processes using different etchants. For example, a photoresist layer can be coated over the dielectric layer 210 and exposed then developed to form a desired pattern. In the one-etching case, an etching process can be performed using the patterned photoresist layer as a mask and using an etchant that can etch the materials of the dielectric layer 210, the hard-mask layer 208, and the dielectric layer 206 (and in some embodiments also the second dielectric layer 204), to form the initial recesses 220 in one step. In some embodiments, dry plasma etching can be used in the one-etching case. Dry plasma etching can etch the materials for the dielectric layer 210, the hard-mask layer 208, and the dielectric layer 206 (and in some embodiments also the second dielectric layer 204) without high etching selectivity between any two of these layers.

In the multi-etching case, an etching process can be performed using the patterned photoresist layer as a mask and using an etchant that can etch the material of the dielectric layer 210 much faster than etching the material of the hard-mask layer 208, to remove portions of the dielectric layer 210 not covered by the photoresist. Then the photoresist can be removed and another etching process can be performed using the patterned dielectric layer 210 as a mask and using an etchant that can etch the material of the hard-mask layer 208 much faster than etching the materials of the dielectric layer 210 and the dielectric layer 206, to remove portions of the hard-mask layer 208 not covered by the patterned dielectric layer 210. Similarly, another etching process can be performed using patterned hard-mask layer 208 as a mask and using an etchant that can etch the material of the dielectric layer 206 much faster than etching the materials of the hard-mask layer 208 and the second dielectric layer 204, to eventually form the initial recesses.

In the example shown in FIGS. 2C and 2D, the dielectric layer 210 is formed over the hard-mask layer 208 and etched to have a same pattern as the hard-mask layer 208. In some other embodiments, the dielectric layer 210 can be omitted and the hard-mask layer 208 can be patterned directly using a patterned photoresist layer as a mask.

Figure 2E:
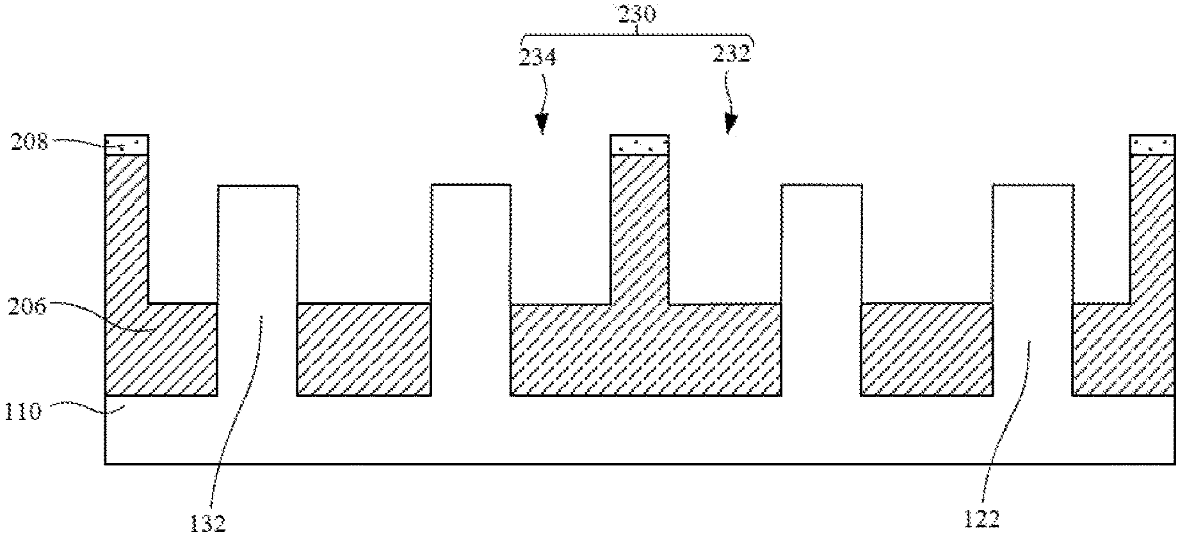

FIG. 2E schematically shows a next stage during the fabrication of the semiconductor device. As shown in FIG. 2E, the dielectric layer 210 is removed and an etching process is performed using the patterned hard-mask layer 208 as an etching mask to further etch the dielectric layer 206. In some embodiments, the dielectric layer 210 can be made of a same or similar material as the dielectric layer 206 (e.g., both are formed of silicon oxide), and hence the dielectric layer 210 does not need to be separately removed and can be removed in the same process as etching the dielectric layer 206.

The etching process shown in FIG. 2E removes a plurality of portions of the dielectric layer 206 in the plurality of regions to form a plurality of intermediate recesses 230 (i.e., the initial recesses 220 are deepened to form the intermediate recesses 230, and hence the initial recesses 220 can be viewed as intermediate products during the overall etching process to form the intermediate recesses 230). For example, the etching process removes a portion of the dielectric layer 206 in the first region to form a first intermediate recess 232 and removes a portion of the dielectric layer 206 in the second region to form a second intermediate recess 234. The plurality of intermediate recesses 230 can have an approximately same depth. Further, as shown in FIG. 2E, the etching process also exposes at least a portion of each of the plurality of mesas, such as the first mesa(s) in the first region and the second mesa(s) in the second region.

In some embodiments, the etching process shown in FIG. 2E can include vapor etching, which is performed to reach a desired depth to form the plurality of intermediate recesses 230 and expose a desired portion of each of the mesas. That is, in some embodiments, dry plasma etching can be used to form the initial recesses 220 as described above and then vapor etching can be used to deepen the initial recesses 220 to form the intermediate recesses 230. Dry plasma etching can be anisotropic and vapor etching can be isotropic. Thus, using dry plasma etching can obtain a better etching profile. Further, dry plasma etching is less expensive than vapor etching. Using dry plasma etching to form the initial recesses 220 can reduce the overall cost of forming the semiconductor device. However, vapor etching can have a high etching selectivity between the material for the dielectric layer 206 and the material for the substrate 110 (and hence the material for the mesas). For example, vapor etching can etch the material for the dielectric layer 206, e.g., silicon oxide, much faster than etching the material for the mesas, e.g., silicon. Therefore, no or only a very small portion of the mesas will be etched away during the etching process for forming the intermediate recesses 230. Further, vapor etching usually causes less damage to the material of the mesas, such as silicon, than dry plasma etching and it is easier to control etching depth in a vapor etching process. Therefore, using vapor etching to deepen the initial recesses 220 to form the intermediate recesses 230 can better maintain the profile of the mesas and control the depth of the intermediate recesses 230.

In this disclosure, the etching process to form the initial recesses 220 and the etching process to deepen the initial recesses 220 to form the intermediate recesses 230 collectedly, or either of the etching process to form the initial recesses 220 and the etching process to deepen the initial recesses 220 to form the intermediate recesses 230 alone, can be referred to as a "first etching." In some other embodiments, the processing wafer can be directly etched to form the intermediate recesses 230, i.e., without forming the initial recesses 220 first. In this scenario, the "first etching" can also refer to this etching process that directly forms the intermediate recesses 230. In other words, the "first etching" can refer to a single-step etching that forms the intermediate recesses 230, a multi-step etching that eventually forms the intermediate recesses 230, or any one or more etching processes in the multi-step etching. Correspondingly, the portion of the dielectric layer 206 in the first region that is removed by the first etching can be referred to as a "first portion" of the dielectric layer 206 removed by the first etching, and the portion of the dielectric layer 206 in the second region that is removed by the first etching can be referred to as a "second portion" of the dielectric layer 206 removed by the first etching. In the first etching, the hard-mask layer 208, which is patterned to expose the first region and the second region, can be used as a hard mask and hence the first portion and the second portion of the dielectric layer 206 that are not covered by the hard-mask layer 208 can be removed.

Figure 2F:
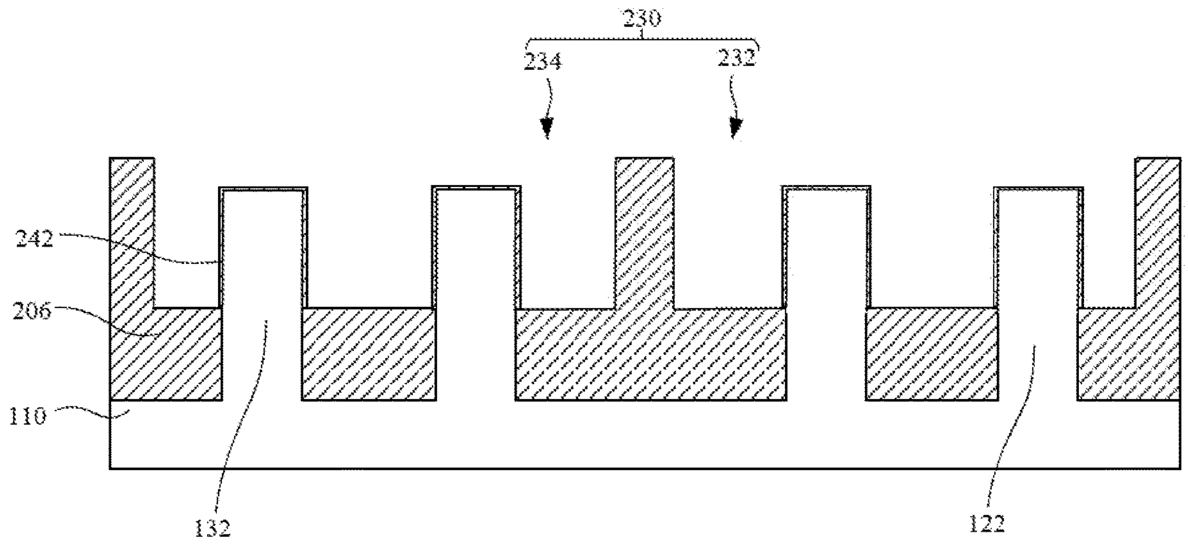

FIG. 2F schematically shows a next stage during the fabrication of the semiconductor device. As shown in FIG. 2F, the hard-mask layer 208 is removed. The hard-mask layer 208 can be removed by, e.g., etching. As described above, the processing wafer up to this point has been subjected to multiple etching processes, including, for example, the etching to expose the plurality of mesas and the etching to remove the hard-mask layer 208. During such etching processes, exposed surfaces of the mesas may be damaged, e.g., forming a lot of surface defects, which may impact the performance of the final semiconductor device, such as causing leakage current. Therefore, in some embodiments, as shown in FIG. 2F, a sacrificial layer 242 is formed over the exposed portions of the plurality of mesas to, e.g., repair the damages at the surfaces of the mesas. In some embodiments, the sacrificial layer 242 can be formed by causing surface portions of the mesas to react with a reactant, e.g., the surface portions of the mesas can be oxidized to form a sacrificial oxide layer. For example, the substrate 110, and hence the mesas, include silicon, and the surface portions of the silicon mesas can be subjected to thermal oxidation to form a silicon oxide layer as the sacrificial layer 242.

Figure 2G:
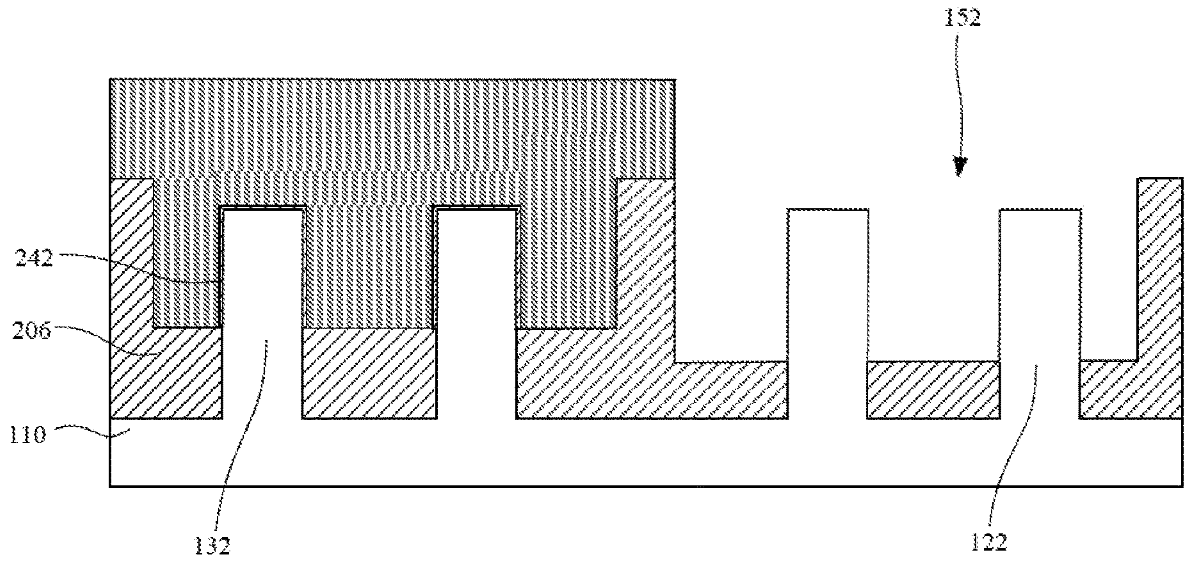

FIG. 2G schematically shows a next stage during the fabrication of the semiconductor device. As shown in FIG. 2G, photoresist is coated over the processing wafer and patterned to form a first photoresist layer that covers the second region and exposes the first region. A second etching is then performed to deepen the first intermediate recess 232 to form the first recess 152 having the first etching depth. That is, the second etching can be performed until a vertical distance from a top of the dielectric layer 206 to the bottom of the first recess reaches the first etching depth (i.e., until a vertical distance from a top of the first mesa (serving as the first fin 122) to the bottom of the first recess reaches the first height). The second etching can include, for example, a first vapor etching performed for a first period of time. In some embodiments, the second etching can also remove a portion of the sacrificial layer 242 that is over the first mesa. The photoresist can be removed after the second etching.

Figure 2H:
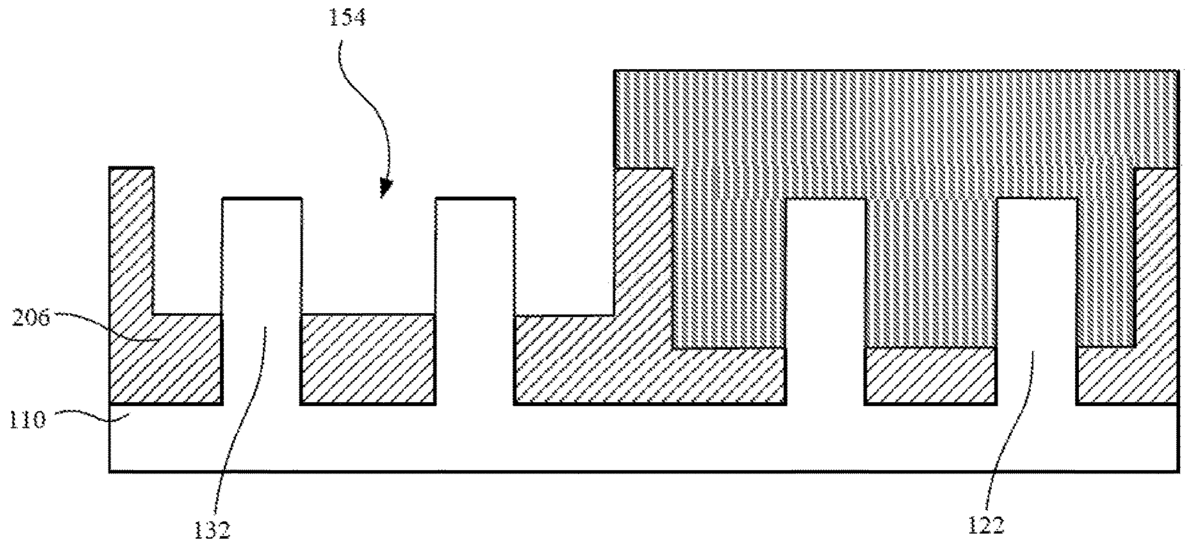

FIG. 2H schematically shows a next stage during the fabrication of the semiconductor device. As shown in FIG. 2H, photoresist is coated over the processing wafer and patterned to form a second photoresist layer that covers the first region and exposes the second region. A third etching is then performed to deepen the second intermediate recess 234 to form the second recess 154 having the second etching depth. That is, the third etching can be performed until a vertical distance from the top of the dielectric layer 206 to the bottom of the second recess reaches the second etching depth (i.e., until a vertical distance from a top of the second mesa (serving as the second fin 132) to the bottom of the second recess reaches the second height). The second height can be different from, e.g., smaller than the first height. In some embodiments, a difference between the first height and the second height can be within a range from about 0 nm to about 20 nm, such as from about 10 nm to about 20 nm. The third etching can include, for example, a second vapor etching performed for a second period of time. The second period of time can be different from, e.g., shorter than the first period of time. In some embodiments, the third etching can also remove a portion of the sacrificial layer 242 that is over the second mesa.

Figure 2I:
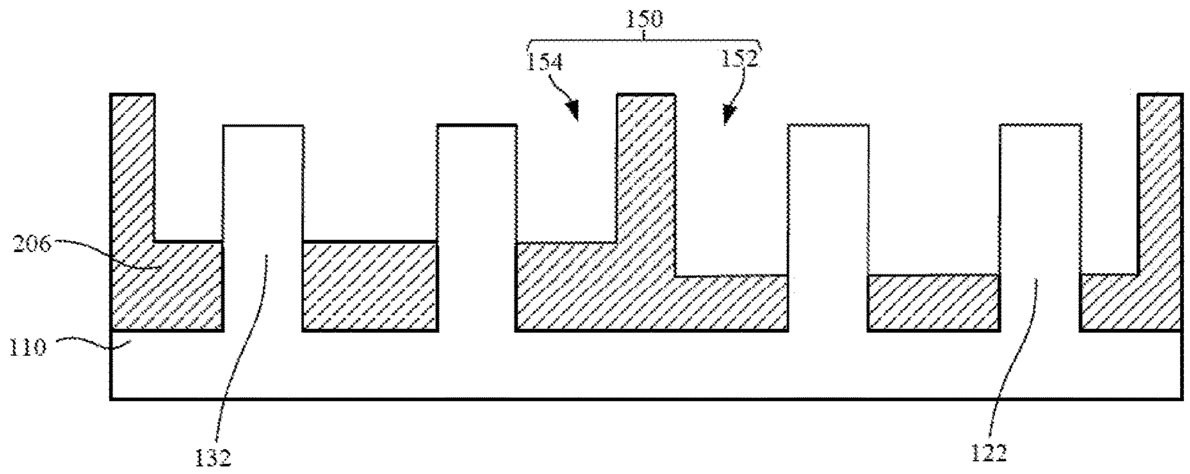

Then, as shown in FIG. 2I, the photoresist is removed, exposing the first recess 152.

Here, the term "first recess" can refer to the final first recess 152 shown in FIGS. 2G-2I, and can also refer to a recess as an intermediate state at any time during the formation of the final first recess 152, such as the first initial recess 222 or the first intermediate recess 232. Similarly, the term "second recess" can refer to the final second recess 154 shown in FIGS. 2H and 2I, and can also refer to a recess as an intermediate state at any time during the formation of the final second recess 154, such as the second initial recess 224 or the second intermediate recess 234.

In the example shown in FIG. 2H, the third etching is performed to deepen the second recess to the second etching depth. In some other embodiments, after the first etching, the depth of the second recess has already reached the second etching depth (i.e., the vertical distance from the top of the second mesa to the bottom of the second recess has already reached the second height). In this scenario, the third etching can be omitted.

After the recesses 150 (including the first recess 152 and the second recess 154) are formed, other fabrication processes can be performed to form the final semiconductor device, e.g., the semiconductor device 100 shown in FIGS. 1A and 1B. For example, a first gate structure can be formed over the first mesa (the first gate structure including a first gate conductor layer and a first gate insulation layer sandwiched between the first mesa and the first gate conductor layer) and a second gate structure can be formed over the second mesa (the second gate structure including a second gate conductor layer and a second gate insulation layer sandwiched between the second mesa and the second gate conductor layer). Then, ion implantations can be performed, e.g., using the gate structures as masks to form LDD regions in the mesas. Since the first mesa has a greater height than the second mesa, ions can be implanted into a deeper depth in the first mesa than into the second mesa to form a deeper LDD region in the first mesa than in the second mesa. For example, the first mesa can be covered using photoresist and ions can be implanted into the second mesa to form an LDD region with a desired depth, and the second mesa can be covered using photoresist and ions can be implanted into the first mesa to form an LDD region with a desired depth. Thus, the depth of the LDD regions in different FinFETs can better match the height of the fins in the different FinFETs, to improve the performance of the different FinFETs.

In the example described above, both the gate insulation layer over the first mesa and the gate insulation layer over the second mesa are formed after the third etching. In some other embodiments, the gate insulation layer over the first mesa can be formed before the third etching. During the third etching, the gate insulation layer over the first mesa can be protected by the photoresist and hence can be intact.

FIGS. 3A-3D are cross-sectional views showing certain stages during another example fabrication process of an example semiconductor device consistent with the disclosure. FIGS. 3A-3D only show a portion of the semiconductor device. The semiconductor device can be, e.g., the semiconductor device 100 described above.

Figure 3A:
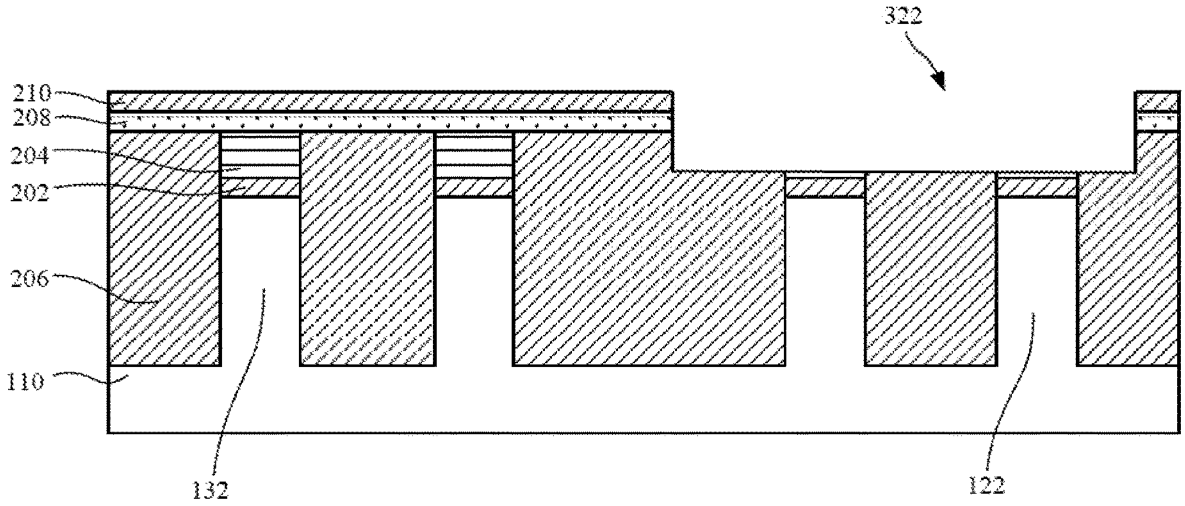
FIGS. 3A-3D are cross-sectional views showing certain stages during another example fabrication process of an example semiconductor device consistent with the disclosure.

Consistent with the disclosure, a processing wafer can be provided. The processing wafer can be the processing wafer shown in FIG. 2C and prepared by the processes described above in connection with FIGS. 2A-2C. Then, as shown in FIG. 3A, a first etching is performed to pattern the dielectric layer 210 and the hard-mask layer 208, and to remove a portion of the dielectric layer 206 in a first region to form a first initial recess 322 having a first initial depth. Similar to the embodiments described above in connection with FIGS. 2A-2I, the first region here is a region having the first mesa that serves as the first fin 122. In the example shown in FIG. 3A, the first etching can end at the second dielectric layer 204. In some embodiments, portions of the second dielectric layer 204 can also be etched away. As shown in FIG. 3A, after the first etching, the first mesa remains covered by the first dielectric layer 202 and the dielectric layer 206.

In some embodiments, the first etching can be performed for a first period of time using an etchant. For example, the first etching can include a first dry plasma etching.

In some embodiments, before the first etching is performed, photoresist can be coated over the processing wafer and patterned to form a first photoresist layer that exposes the first region and covers a second region. Similar to the embodiments described above in connection with FIGS. 2A-2I, the second region here is a region having the second mesa that serves as the second fin 124. After the first etching, the first photoresist layer can be removed.

Figure 3B:
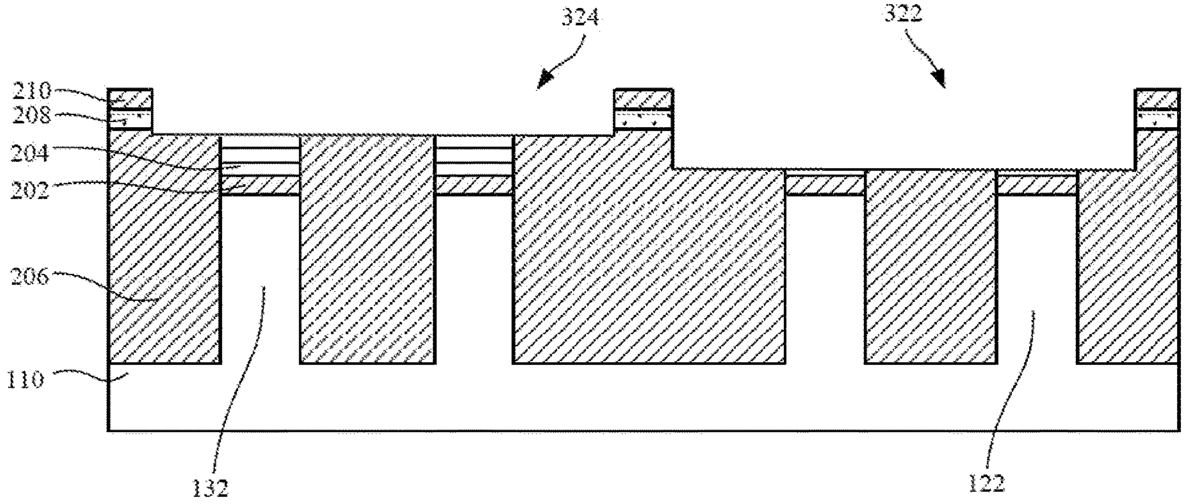

FIG. 3B schematically shows a next stage during the fabrication of the semiconductor device. As shown in FIG. 3B, a second etching is performed to pattern the dielectric layer 210 and the hard-mask layer 208, and to remove a portion of the dielectric layer 206 in the second region to form a second initial recess 324 having a second initial depth. The second initial depth can be different from, e.g., smaller than the first initial depth. In some embodiments, a difference between the first initial depth and the second initial depth can be within a range from about 0 nm to about 40 nm, such as from about 30 nm to about 40 nm.

In some embodiments, the second etching can be performed for a second period of time using an etchant same as the etchant used for the first etching. For example, the second etching can include a second dry plasma etching. The second period of time can be different from, e.g., shorter than the first period of time.

Similar to the first etching described in connection with FIG. 3A, in the example shown in FIG. 3B, the second etching can end at the second dielectric layer 204. In some embodiments, portions of the second dielectric layer 204 can also be etched away, but the amount of the second dielectric layer 204 etched away during the second etching can be smaller than the amount of the second dielectric layer 204 etched away during the first etching. As shown in FIG. 3B, after the second etching, the second mesa remains covered by the first dielectric layer 202 and the dielectric layer 206.

In some embodiments, before the second etching is performed, photoresist can be coated over the processing wafer and patterned to form a second photoresist layer that exposes the second region and covers the first region. After the second etching, the second photoresist layer can be removed.

Figure 3C:
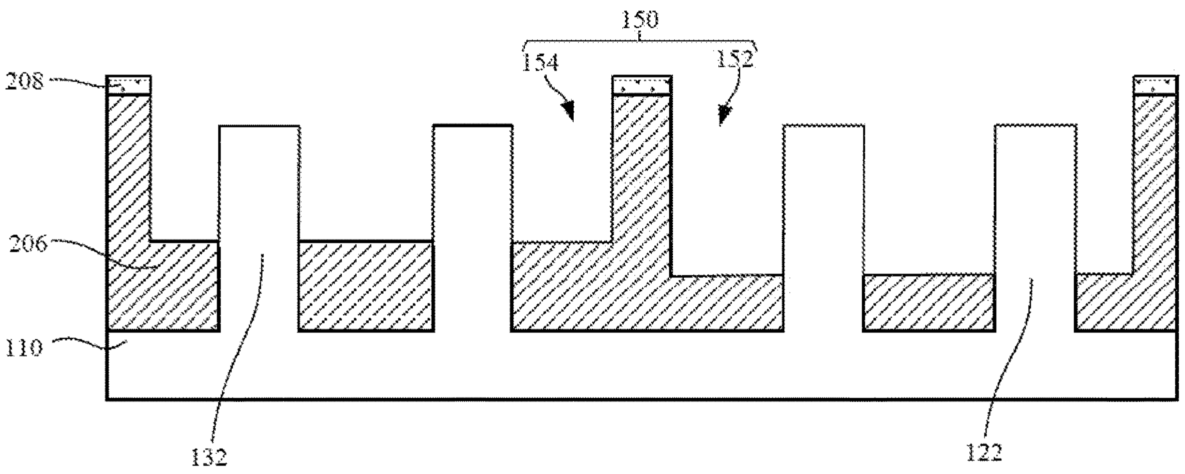

FIG. 3C schematically shows a next stage during the fabrication of the semiconductor device. As shown in FIG. 3C, a third etching is performed to deepen the first initial recess 322 and the second initial recess 324 to form the first recess 152 and the second recess 154. The third etching can include, e.g., vapor etching to reduce the damage to the mesas. At the end of the third etching, a vertical distance from a top of the first mesa to the bottom of the first recess 152 reaches the first height, and a vertical distance from a top of the second mesa to the bottom of the second recess 154 reaches the second height. The second height can be different from, e.g., smaller than the first height. In some embodiments, a difference between the first height and the second height can be approximately same as the difference between the first initial depth and the second initial depth.

As shown in FIGS. 3A and 3B, the hard-mask layer 208 is patterned to expose the first region and the second region during the first etching and the second etching. The patterned hard-mask layer 208 can be used as a hard mask during the third etching.

Here, the term "first recess" can refer to the final first recess 152 shown in FIG. 3C, and can also refer to a recess as an intermediate state at any time during the formation of the final first recess 152, such as the first initial recess 322. Similarly, the term "second recess" can refer to the final second recess 154 shown in FIG. 2C, and can also refer to a recess as an intermediate state at any time during the formation of the final second recess 154, such as the second initial recess 324.

Figure 3D:
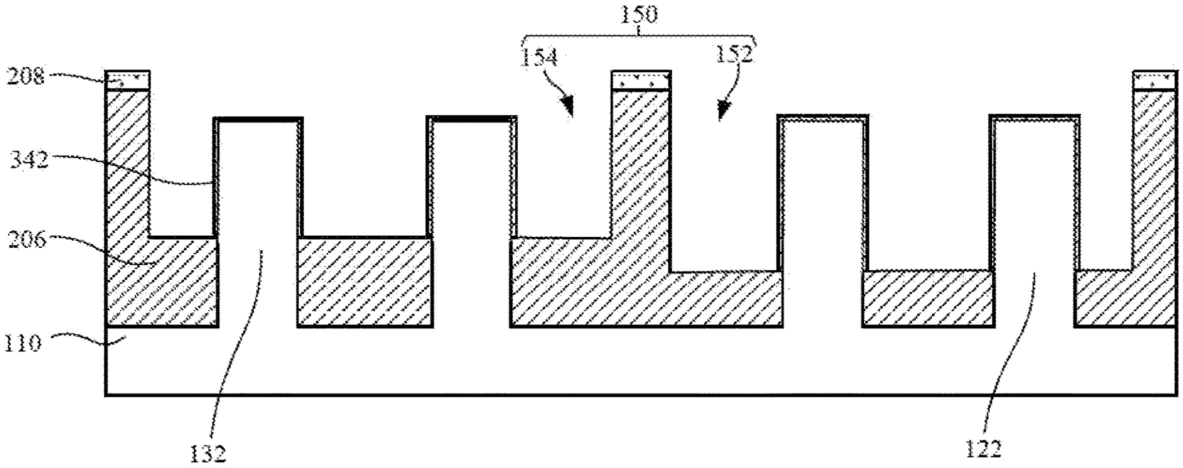

FIG. 3D schematically shows a next stage during the fabrication of the semiconductor device. As shown in FIG. 3D, a sacrificial layer 342 is formed over the exposed portions of the plurality of mesas to, e.g., repair the damages at the surfaces of the mesas. In some embodiments, the sacrificial layer 342 can be formed by causing surface portions of the mesas to react with a reactant, e.g., the surface portions of the mesas can be oxidized to form a sacrificial oxide layer. For example, the substrate 110, and hence the mesas, include silicon, and the surface portions of the silicon mesas can be subjected to thermal oxidation to form a silicon oxide layer as the sacrificial layer 342. In some embodiments, the sacrificial layer 342 can be removed in the subsequent processes, for example, removed before forming gate insulation layers.

In some embodiments, the hard-mask layer 208 can be removed after the third etching and before subsequent processes that form other structures of the semiconductor device. The hard-mask layer 208 can be removed before or after the sacrificial layer 342 is formed.

Then, similar to the embodiments described above in connection with FIGS. 2A-2I, after the recesses 150 (including the first recess 152 and the second recess 154) are formed, other fabrication processes can be performed to form the final semiconductor device, e.g., the semiconductor device 100 shown in FIGS. 1A and 1B. Such fabrication processes are described above and are not repeated here.

Figure 4:
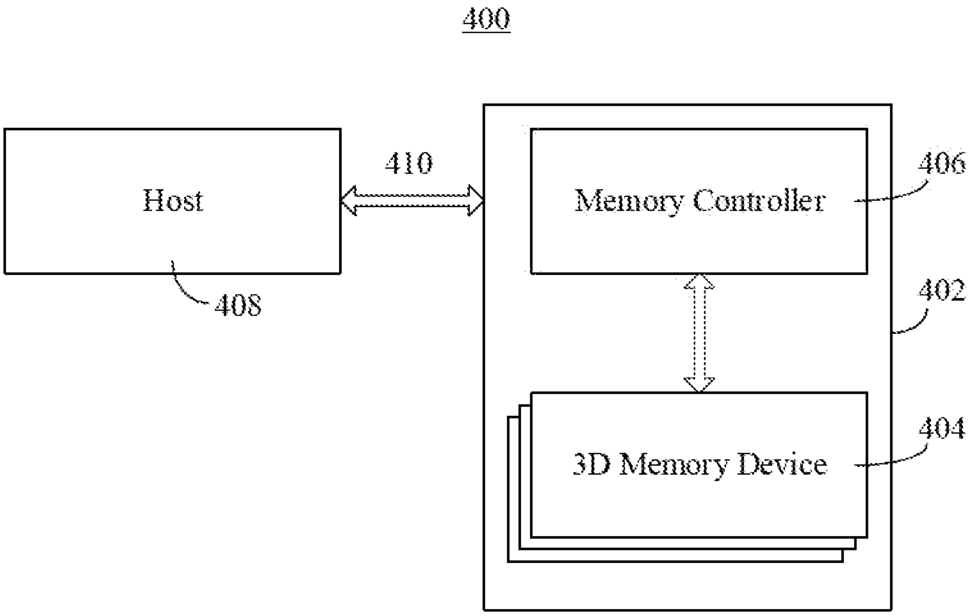
FIG. 4 is a block diagram of an example system consistent with the disclosure.

FIG. 4 is a block diagram of an example system 400 having a memory device consistent with the disclosure. The system 400 can be a mobile phone (e.g., a smartphone), a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic device having storage therein. As shown in FIG. 4, the system 400 includes a host 408 and a memory system 402 having one or more memory devices 404 and a memory controller 406. The host 408 can be a processor of an electronic device, such as a central processing unit (CPU), or a system-on-chip (SoC), such as an application processor (AP). The host 408 can be configured to send or receive data to or from the one or more memory devices 404. Each of the one or more memory devices 404 can include a semiconductor device consistent with the disclosure, such as one of the example semiconductor devices described above.

The memory controller 406 is coupled to the one or more memory devices 404 and the host 408, and is configured to control the one or more memory devices 404, according to some implementations. The memory controller 406 can also be integrated into the one or more memory devices 404. The memory controller 406 can manage the data stored in the one or more memory devices 404 and communicate with the host 408 via an interface 410. In some embodiments, the memory controller 406 is designed for operating in a low duty-cycle environment, such as a secure digital (SD) card, a compact Flash (CF) card, a universal serial bus (USB) Flash drive, or another medium for use in electronic devices, such as personal computers, digital cameras, mobile phones, etc. In some other embodiments, the memory controller 406 is designed for operating in a high duty-cycle environment, such as a solid-state drive (SSD) or an embedded multimedia-card (eMMC) used as data storage for mobile devices, such as smartphones, tablets, laptop computers, etc., and enterprise storage arrays. The memory controller 406 can be configured to control operations of the one or more memory devices 404, such as read, erase, and program operations.

Figure 5:
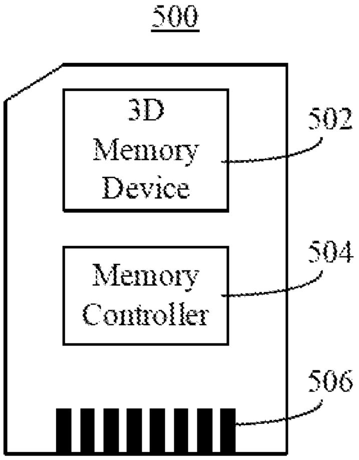
FIG. 5 is a block diagram of an example memory card consistent with the disclosure.
Figure 6:
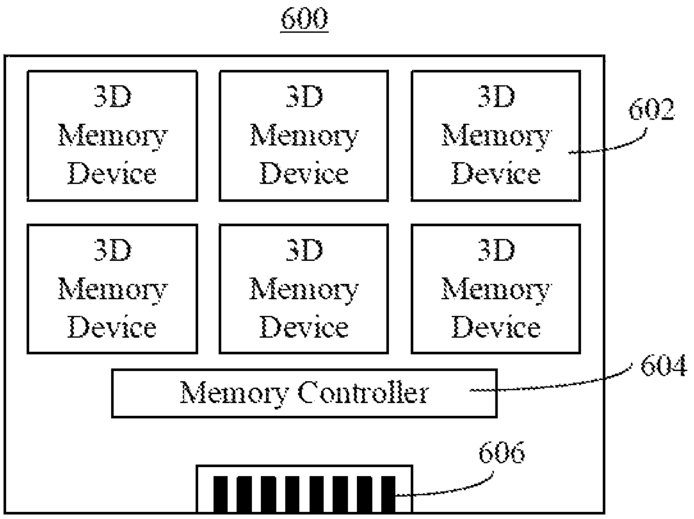
FIG. 6 is a block diagram of an example solid-state drive consistent with the disclosure.

The memory controller 406 and the one or more memory devices 404 can be integrated into various types of storage devices, for example, be included in the same package, such as a universal Flash storage (UFS) package or an eMMC package. That is, the memory system 402 can be implemented and packaged into different types of end electronic products. FIGS. 5 and 6 are block diagrams of an example memory card 500 and an example SSD 600, respectively, consistent with the disclosure. As shown in FIG. 5, a single memory device 502 and a memory controller 504 are integrated into the memory card 500. The memory device 502 can include a semiconductor device consistent with the disclosure, such as one of the above-described example semiconductor devices. The memory card 500 can include a PC card (personal computer memory card international association (PCMCIA)), a CF card, a smart media (SM) card, a memory stick, a multimedia card (MMC, RS-MMC, or MMCmicro), an SD card (SD, miniSD, microSD, or SDHC), a UFS, etc. As shown in FIG. 5, the memory card 500 further includes a memory card interface or interface connector 506 configured to couple the memory card 500 to a host (e.g., the host 408 shown in FIG. 4).

As shown in FIG. 6, multiple memory devices 602 and a memory controller 604 are integrated into the SSD 600. Each of the memory devices 602 can include a semiconductor device consistent with the disclosure, such as one of the above-described semiconductor devices. As shown in FIG. 6, the SSD 600 further includes an SSD interface or interface connector 606 configured to couple the SSD 600 to a host (e.g., the host 408 shown in FIG. 4).

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor device fabrication method comprising:

forming a dielectric layer on a semiconductor substrate;

forming a first recess and a second recess in the dielectric layer;

forming an isolator having a first sidewall and a second sidewall, the first sidewall being a sidewall of the first recess and the second sidewall being a sidewall of the second recess, and the isolator being a portion of the dielectric layer;

forming a first FinFET in the first recess, the first FinFET including a first fin; and forming a second FinFET in the second recess, the second FinFET including a second fin, wherein:

a first recess depth measured from a topmost surface of the first fin to a bottommost surface of the first recess is different from a second recess depth measured from a topmost surface of the second fin to a bottommost surface of the second recess; and the first recess depth and the second recess depth are greater than zero nm.

2. The semiconductor device fabrication method of claim 1, wherein a depth difference between the first recess depth and the second recess depth is smaller than 20 nm.

3. The semiconductor device fabrication method of claim 2, wherein the depth difference is in a range from about 10 nm to about 20 nm.

4. The semiconductor device fabrication method of claim 1, wherein a depth difference between the first recess depth and the second recess depth is smaller than 40 nm.

5. The semiconductor device fabrication method of claim 4, wherein the depth difference is in a range from about 30 nm to about 40 nm.

6. The semiconductor device fabrication method of claim 1, wherein:

the first FinFET further includes a first gate structure over the first fin, the first gate structure including a first gate conductor layer and a first gate insulation layer sandwiched between the first fin and the first gate conductor layer; and the second FinFET further includes a second gate structure over the second fin, the second gate structure including a second gate conductor layer and a second gate insulation layer sandwiched between the second fin and the second gate conductor layer.

7. The semiconductor device fabrication method of claim 6, wherein:

a highest point of the first gate structure is at a different height than a highest point of the second gate structure.

8. The semiconductor device fabrication method of claim 1, wherein a first etching depth measured from a top of the dielectric layer to the bottommost surface of the first recess is different from a second etching depth measured from the top of the dielectric layer to the bottommost surface of the second recess.

9. The semiconductor device fabrication method of claim 1, wherein a highest point of the first fin is at a different height than a highest point of the second fin.

10. A semiconductor device comprising:

a dielectric layer;

a first recess and a second recess formed in the dielectric layer;

an isolator having a first sidewall and a second sidewall, the first sidewall being a sidewall of the first recess and the second sidewall being a sidewall of the second recess, and the isolator being a portion of the dielectric layer;

a first FinFET formed in the first recess, the first FinFET including a first fin; and a second FinFET formed in the second recess, the second FinFET including a second fin, wherein:

a first recess depth measured from a topmost surface of the first fin to a bottommost surface of the first recess is different from a second recess depth measured from a topmost surface of the second fin to a bottommost surface of the second recess; and the first recess depth and the second recess depth are greater than zero nm.

11. The semiconductor device of claim 10, wherein a depth difference between the first recess depth and the second recess depth is smaller than 20 nm.

12. The semiconductor device of claim 11, wherein the depth difference is in a range from about 10 nm to about 20 nm.

13. The semiconductor device of claim 10, wherein a depth difference between the first recess depth and the second recess depth is smaller than 40 nm.

14. The semiconductor device of claim 13, wherein the depth difference is in a range from about 30 nm to about 40 nm.

15. The semiconductor device of claim 10, wherein:

the first FinFET further includes a first gate structure over the first fin, the first gate structure including a first gate conductor layer and a first gate insulation layer sandwiched between the first fin and the first gate conductor layer; and the second FinFET further includes a second gate structure over the second fin, the second gate structure including a second gate conductor layer and a second gate insulation layer sandwiched between the second fin and the second gate conductor layer.

16. The semiconductor device of claim 15, wherein a highest point of the first gate structure is at a different height than a highest point of the second gate structure.

17. The semiconductor device of claim 10, wherein a first etching depth measured from a top of the dielectric layer to the bottommost surface of the first recess is different from a second etching depth measured from the top of the dielectric layer to the bottommost surface of the second recess.

18. The semiconductor device of claim 10, wherein a highest point of the first fin is at a different height than a highest point of the second fin.

19. The semiconductor device of claim 10, further comprising:

a semiconductor substrate;

wherein:

the first fin and the second fin are formed from the semiconductor substrate; and the dielectric layer is formed over the semiconductor substrate.

20. A memory system comprising:

a memory device including the semiconductor device of claim 10; and a memory controller configured to control operation of the memory device.

* * * * *